United States Patent [19]

Iwasa

[11] Patent Number: 5,763,142
[45] Date of Patent: Jun. 9, 1998

[54] METHOD FOR FORMING RESIST PATTERN

[75] Inventor: Shigeyuki Iwasa, Tokyo, Japan

[73] Assignee: NEC Corporation, Tokyo, Japan

[21] Appl. No.: 807,180

[22] Filed: Feb. 27, 1997

[51] Int. Cl.$^6$ ..................................... G03C 5/00
[52] U.S. Cl. ............... 430/322; 430/275.1; 430/326; 430/327
[58] Field of Search ..................... 430/322, 327, 430/326, 275.1

[56] References Cited

U.S. PATENT DOCUMENTS 5,552,256  9/1996  Aviram et al. ............................ 430/192

FOREIGN PATENT DOCUMENTS 7092694  4/1995  Japan .

OTHER PUBLICATIONS

Hiroshi Ito, et al. "Application of Photoinitiators to the Design of Resists for Semiconductor Manufcturing", American Chemical Society Symposium Series, vol. 242, 1984, pp. 11–23.

T. Tokuyama, "Semicondutor Dry Etching Techniques", published by Sangyo Tosho, 1992, pp. 181–186.

English translation of JP 64-51622, Feb. 1989.

Y. Kawai et al.; "Environmental Stability of KrF Positive Chemically Amplified Resist with an Organic Base"; 47th Semiconductor Intergrated Circuit Symposium, (1994), pp. 18–23.

Primary Examiner—Janet C. Baxter
Assistant Examiner—Rosemary Ashton
Attorney, Agent, or Firm—Whitham, Curtis & Whitman

[57] ABSTRACT

Disclosed is a method for forming a resist pattern in which a chemically amplified resist which has a photosensitive acid-generating agent with a catalytic function is used, has the step of: treating the surface of nitrided metal film or nitrided semimetal film deposited on a substrate by using a substance that reduces the basicity of a basic substance which exists on the surface of nitrided metal film or nitrided semimetal film or which is chemically coupled with the nitrided metal film or nitrided semimetal film.

2 Claims, 2 Drawing Sheets

METHOD FOR FORMING RESIST PATTERN

FIELD OF THE INVENTION

This invention relates to a method for forming a resist pattern, and more particularly to, a method for forming a resist pattern in which a chemically amplified resist is used.

BACKGROUND OF THE INVENTION

Recently, photosensitive compounds are in wide use in the fabrication field of various devices that require the fine processing, such as a semiconductor device. To obtain a device with higher integration density, the fine patterning is required, wherein a shorter exposure wavelength is effective. Therefore, a resist material which is highly sensitive to deep UV light such as eximer laser is desired.

Now, chemically amplified resists with optically acid-generating agents have been researched since they may significantly improve the sensitivity (for example, Hiroshi Ito, C. Grant Willson, American Chemical Society Symposium Series, vol. 242, pp. 11–23 (1984)).

The chemically amplified resist is characterized in that proton acid, which is generated by an optically acid-generating agent that is an ingredient of the resist and generates acid when it is irradiated, is moved in the resist solid phase by heat treatment after the exposure, thereby catalyzing the reaction of the resist resin to amplify it several hundred to several thousand times. Thus, as compared with conventional resists which have a photoreaction efficiency (reaction per one photon) less than 1, it can be provided with an extremely high sensitivity.

In general, in a lithography step of the fabrication process of a semiconductor device, a resist pattern is formed on nitrided metal film or nitrided semimetal film such as titanium nitride film, silicon nitride film which is deposited on a substrate. For example, the titanium nitride film has a high optical absorption characteristic to exposure light and a high selectivity from a resist in the etching process and it can be left as it is after the etching process. Therefore, it is used as reflection reducing film to the base in the process of forming wiring metal film of aluminum.

However, when the resist patterning is conducted by using a chemically amplified resist on nitrided metal film such as titanium nitride or nitrided semimetal film, the resist form may have a skirt in the use of positive-type resist and a neck in the use of negative-type resist. The skirt or neck of the resist form will cause problems when film on a substrate is etched by using the patterned resist as a mask. For example, when the anisotropy of etching is not high, the etched film will have a tapered sectional form. On the other hand, when the selectivity between resist and film is not high, by the etching, the resist is likely to get back and the dimensional conversion difference of film section is likely to increase (Tokuyama, 'Semiconductor Dry Etching Techniques', pp. 181–186, published by Sangyo Tosho (1992)).

SUMMARY OF THE INVENTION

Accordingly, it is an object of the invention to provide a method for forming a resist pattern by which a good resist pattern with no skirt or neck can be formed.

According to the invention, a method for forming a resist pattern in which a chemically amplified resist which includes a photosensitive acid-generating agent with a catalytic function is used, comprises the step of:

treating the surface of nitrided metal film or nitrided semimetal film deposited on a substrate by using a substance that reduces the basicity of a basic substance which exists on the surface of nitrided metal film or nitrided semimetal film or which is chemically coupled with the nitrided metal film or nitrided semimetal film.

BRIEF DESCRIPTION OF THE DRAWINGS

The invention will be explained in more detail in conjunction with the appended drawings, wherein.

DESCRIPTION OF THE PREFERRED EMBODIMENTS

Methods for forming a resist pattern in preferred embodiments according to the invention will be explained below.

Figure 3:
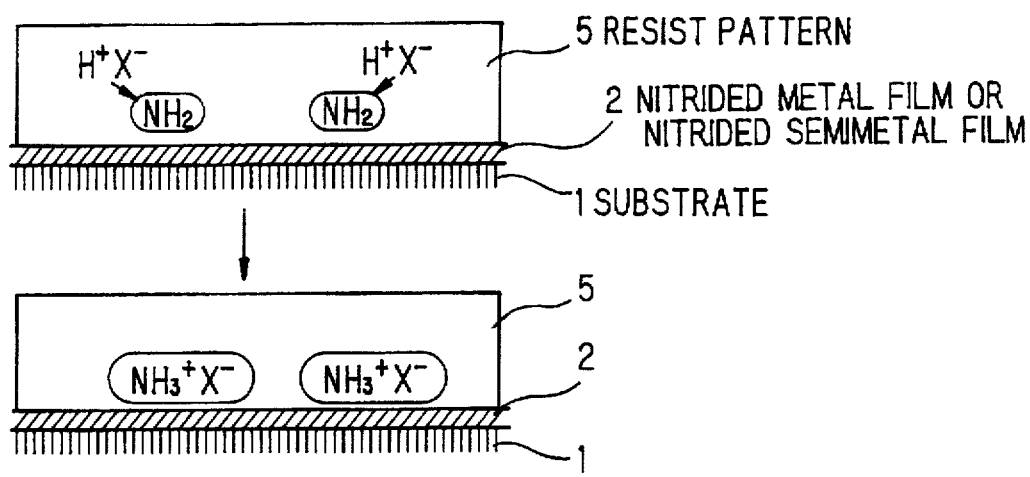
FIG. 3 shows a state that acid ($H^+X^-$) generated from an optical acid-generating agent reacts with a basic substance existing on the surface of nitrided metal film or nitrided semimetal film and is deactivated.

There are suggested some reasons why the resist form has a skirt or a neck when resist patterning is conducted by using a chemically amplified resist on nitrided metal film such as titanium or nitrided semimetal film, such as reflection from the substrate. However, it is supposed that the main reason is that acid ($H^+X^-$) generated from an optical acid-generating agent in a resist 5 by the exposure, as shown in FIG. 3, reacts with a basic substance ($NH_2$ in FIG. 3) that exists on the surface of nitrided metal film 2 on a substrate 1 and is thereby deactivated (Y. Kawai, A. Ohtaka, J. Nakamura, K. Tanaka and M. Matsuda, 47th Semiconductor Integrated Circuit Symposium, pp. 18–23 (1994)).

It is supposed that the basic substance is ammonia, a compound with amino or imino group, which has a strong basicity, existing on the surface of the nitrided metal film or nitrided semimetal film 2, or amino or imino group which is coupling with the film. The basicity of these strong basic substances can be reduced by substituting the proton coupling with nitrogen atom by an electron-attractive functional group since the charge density on nitrogen atom can be thereby reduced. To substitute the proton coupling with nitrogen atom by the electron attractive functional group can be achieved by contacting organic acid with strong acidity with the nitrided metal film or nitrided semimetal film 2, or by contacting organic acid hologenide with the nitrided metal film or nitrided semimetal film 2 under the existence of a proper catalyzer, wherein tertiary amine such as trimethylamine, triethylamine, pyridine is effective.

The organic acid with strong acidity includes sulfonic acid represented by general formula (1):

$$R^1-SO_3H \qquad (1)$$

where $R^1$ represents hydrocarbon group, such as methyl group, ethyl group, propyl group, butyl group, pentyl group, hexyl group, heptyl group, octyl group and phenyl group, or halogenated hydrocarbon group, such as trifluoromethyl group, trichloromethyl group, tribromomethyl group and triiodomethyl group, or carboxylic acid represented by general formula (2):

$$R^2—CO_2H \quad (2)$$

where $R^2$ represents hydrocarbon group, such as methyl group, ethyl group, propyl group, butyl group, pentyl group, hexyl group, heptyl group, octyl group and phenyl group, or halogenated hydrocarbon group, such as trifluoromethyl group, trichloromethyl group, tribromomethyl group and triiodomethyl group.

The organic acid halogenide includes acid halogenide represented by general formula (3):

$$R^3—COX \quad (3)$$

where $R^3$ represents hydrocarbon group, such as methyl group, ethyl group, propyl group, butyl group, pentyl group, hexyl group, heptyl group, octyl group and phenyl group, or halogenated hydrocarbon group, such as trifluoromethyl group, trichloromethyl group, tribromomethyl group and triiodomethyl group, and X represents fluoro group, chloro group, bromo group and iodo group.

Figure 4:
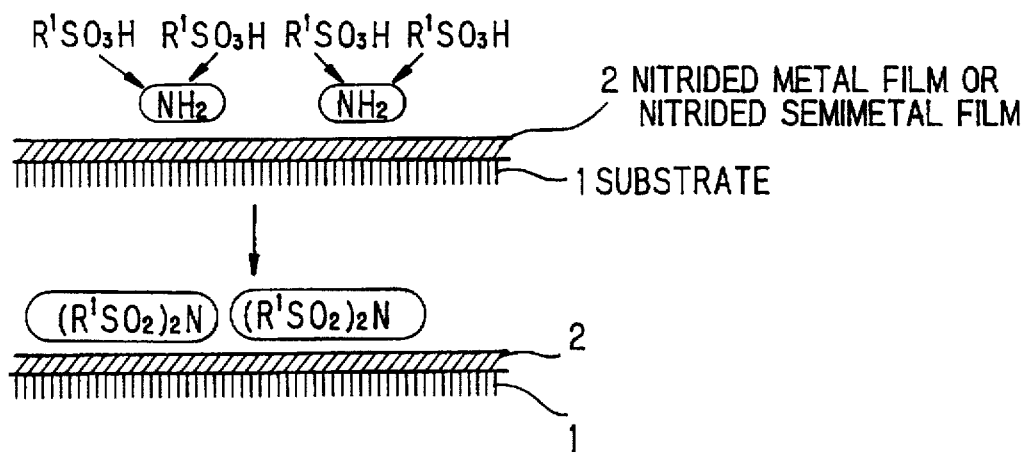
FIG. 4 shows a state that the surface of nitrided metal film or nitrided semimetal film is treated by sulfonated compound and amino group existing on the film is substituted by sulfonyl

For example, when amino group on the nitrided metal film or nitrided semimetal film 2 is treated by using sulfonated compound represented by the general formula (1), the proton of amino group can be, as shown in FIG. 4, substituted by sulfonyl group and the basicity can be thereby reduced. Also, when it is treated by using the compound represented by the general formula (2) or (3), the proton or amino group can be substituted by carboxyl group and the basicity can be thereby reduced as well.

In brief, by treating nitrided metal film such as titanium nitride or nitrided semimetal film on a substrate by using organic acid compound or organic acid halogenide, the proton of ammonia, amino group or imino group, which has a strong basicity, existing on the surface of the nitrided metal film or nitrided semimetal film can be substituted by electron-attractive functional group. Thereby, the charge density on nitrogen atom can be reduced and the basicity of ammonia, amino group or imino group can be reduced. Therefore, the deactivation caused by that acid generated from an optical acid-generating agent by the exposure reacts with a basic substance existing on the surface of a substrate can be prevented. As a result, the forming of a skirt or neck in a resist pattern after exposure can be effectively suppressed.

Next, examples of a method for forming a resist pattern in preferred embodiments according to the invention will be explained below.

EXAMPLE 1

Figure 1:
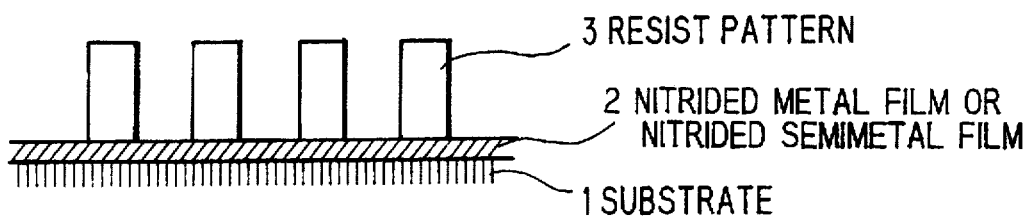
FIG. 1 shows a resist pattern on nitrided metal film or nitrided semimetal film treated by using a method of forming a resist pattern according to the invention.

As shown in FIG. 1, titanium nitride film (=nitrided metal film) 2 is deposited on a Si substrate 1. The Si substrate 1 is then dipped into a solution of 5 ml trifluoromethanesulfonic acid in 95 ml water for 10 min. for surface treatment, thereafter washed with isopropanol and dried. Then, the surface of the titanium nitride film 2 is treated with hexamethyldisilazane (HMDS), thereafter spin-coated with a chemically amplified positive-type resist by using a resist coating machine, and baked at 90° C. for 60 sec., whereby a resist film of 0.7 μm is formed thereon. Then, it is exposed through a pattern mask by using KrF eximer laser exposer with NA of 0.5, σ of 0.7. The resist pattern is directly heated by a hot plate for 60 sec., then developed by using an aqueous solution of 2.38% tetramethylammoniumhydroxide at temperature of 23° C. for 60 sec., rinsed with purified water for 60 sec. As a result, a resist pattern 3 with 0.3 μm line and base, whose sectional form has no skirt as shown in FIG. 1, is obtained.

EXAMPLE 2

Silicon nitride film (=nitrided semimetal film) 2 as a substitute for the titanium nitride film (=nitrided metal film) 2 is deposited on a Si substrate 1. The Si substrate 1 is then dipped into a solution of 5 ml trifluoromethanesulfonic acid in 95 ml water for 10 min. for surface treatment, thereafter washed with isopropanol and dried. Then, the surface of the titanium nitride film 2 is treated with hexamethyldisilazane (HMDS), thereafter spin-coated with a chemically amplified positive-type resist by using a resist coating machine, and baked at 90° C. for 60 sec., whereby a resist film of 0.7 μm is formed thereon. Then, it is exposed through a pattern mask by using KrF eximer laser exposer with NA of 0.5, σ of 0.7. The resist pattern is heated at 90° C. by a hot plate for 60 sec., then developed by using an aqueous solution of 2.38% tetramethylammoniumhydroxide at temperature of 23° C. for 60 sec., rinsed with purified water for 60 sec. As a result, a resist pattern 3 with 0.3 μm line and base, whose sectional form has no skirt as shown in FIG. 1, is obtained.

EXAMPLE 3

In Example 1, the surface treatment is conducted under the condition that benzenesulfonic acid of 3 g is used in place of 5 ml trifluoromethanesulfonic acid and the dipping time of 30 min. is employed, thereafter a resist pattern is patterned. As a result, a resist pattern 3 with 0.3 μm line and base, whose sectional form has no skirt as shown in FIG. 1, is obtained.

EXAMPLE 4

In Example 1, the surface treatment is conducted under the condition that isobutylsulfonic acid of 3 g is used in place of 5 ml trifluoromethanesulfonic acid and the dipping time of 30 min. is employed, thereafter a resist pattern is patterned. As a result, a resist pattern 3 with 0.3 μm line and base, whose sectional form has no skirt as shown in FIG. 1, is obtained.

EXAMPLE 5

In Example 1, the surface treatment is conducted under the condition that trifluoroacetic acid of 5 ml is used in place of 5 ml trifluoromethanesulfonic acid and the dipping time of 1 hour is employed, thereafter a resist pattern is patterned. As a result, a resist pattern 3 with 0.3 μm line and base, whose sectional form has no skirt as shown in FIG. 1, is obtained.

EXAMPLE 6

As shown in FIG. 1, titanium nitride film (=nitrided metal film) 2 is deposited on a Si substrate 1. The Si substrate 1 is then dipped into a solution of 10 ml pyridine in 90 ml methylisobutylketone for 10 min., then adding 10 ml acetyl chloride while agitating the solution for further 10 min. for surface treatment, thereafter washed with isopropanol and dried. Then, the surface of the titanium nitride film 2 is treated with hexamethyldisilazane (HMDS), thereafter spin-coated with a chemically amplified positive-type resist by using a resist coating machine, and baked at 90° C. for 60 sec., whereby a resist film of 0.7 μm is formed thereon. Then, it is exposed through a pattern mask by using KrF eximer laser exposer with NA of 0.5, σ of 0.7. The resist pattern is heated at 90° C. by a hot plate for 60 sec., then developed by using an aqueous solution of 2.38% tetramethylammoniumhydroxide at temperature of 23° C. for 60 sec., rinsed with purified water for 60 sec. As a result, a resist pattern 3 with 0.3 μm line and base, whose sectional form has no skirt as shown in FIG. 1, is obtained.

COMPARATIVE EXAMPLE 1

Figure 2:
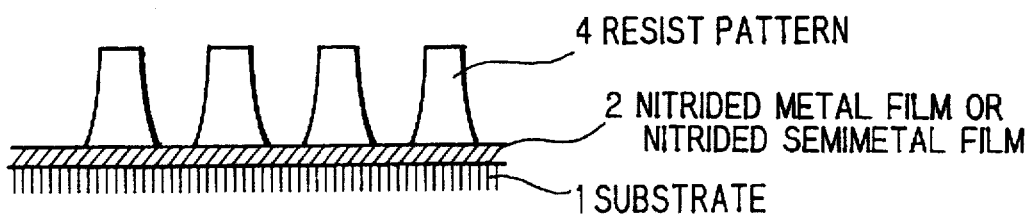
FIG. 2 shows a resist pattern on nitrided metal film or nitrided semimetal film not treated by the above method.

As shown in FIG. 1, titanium nitride film (=nitrided metal film) 2 is deposited on a Si substrate 1. The Si substrate 1 is then treated with hexamethyldisilazane (HMDS), thereafter spin-coated with a chemically amplified positive-type resist by using a resist coating machine, and baked at 90° C. for 60 sec., whereby a resist film of 0.7 μm is formed thereon. Then, it is exposed through a pattern mask by using KrF eximer laser exposer with NA of 0.5, σ of 0.7. The resist pattern is heated at 90° C. by a hot plate for 60 sec., then developed by using an aqueous solution of 2.38% tetramethylammoniumhydroxide at temperature of 23° C. for 60 sec., rinsed with purified water for 60 sec. As a result, a resist pattern 4 with 0.3 μm line and base, whose sectional form has skirts as shown in FIG. 2, is obtained.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for forming a resist pattern in which a chemically amplified resist which includes a photosensitive acid-generating agent with a catalytic function is used, comprising the step of:

treating the surface of nitrided metal film or nitrided semimetal film deposited on a substrate by using a substance that reduces the basicity of a basic substance which exists on said surface of nitrided metal film or nitrided semimetal film or which is chemically coupled with said nitrided metal film or nitrided semimetal film, wherein:

said basicity-reducing substance is an organic acid halogenide represented by:

$$R^3\text{---}COX$$

where $R^3$ represents a hydrocarbon group selected from the group consisting of methyl group, ethyl group, propyl group, butyl group, pentyl group, hexyl group, heptyl group, octyl group and phenyl group, or a halogenated hydrocarbon group selected from the group consisting of trifluromethyl group, trichloromethyl group, tribromomethyl group and triiodomethyl group, and X represents fluoro group, chloro group, bromo group or iodo group, and said organic acid halogenide is used with a catalyzer.

2. A method for forming a resist pattern, according to claim 1, wherein:

said catalyzer is tertiary amine selected from the group consisting of trimethylamine, triethylamine, pyridine and a combination thereof.

\* \* \* \* \*